United States Patent
Iraha et al.

(10) Patent No.: US 8,115,551 B2
(45) Date of Patent: Feb. 14, 2012

(54) AMPLIFYING DEVICE AND ITS CONTROL METHOD

(75) Inventors: Tomoyuki Iraha, Kanagawa (JP); Noriaki Matsuno, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 33 days.

(21) Appl. No.: 12/727,395

(22) Filed: Mar. 19, 2010

(65) Prior Publication Data
US 2010/0253424 A1    Oct. 7, 2010

(30) Foreign Application Priority Data
Apr. 2, 2009  (JP) ................................ 2009-089877

(51) Int. Cl.
    *H03G 3/20* (2006.01)
(52) U.S. Cl. ...................................... 330/279; 330/133
(58) Field of Classification Search .................. 330/133, 330/279
    See application file for complete search history.

(56) References Cited

U.S. PATENT DOCUMENTS
5,298,868 A * 3/1994 Nagano ........................ 330/129

FOREIGN PATENT DOCUMENTS
| JP | 11-251851 | 9/1999 |
| JP | 2002-353756 | 12/2002 |
| JP | 2003-158435 | 5/2003 |

* cited by examiner

*Primary Examiner* — Steven J Mottola
(74) *Attorney, Agent, or Firm* — Young & Thompson

(57) ABSTRACT

An amplifying device comprises a first amplifying unit (91-97) capable of changing its gain in a stepwise manner, a second amplifying unit 99 cascade-connected to the first amplifying unit (91-97), the second amplifying unit being capable of changing its gain in a stepwise manner, and a gain controller 100 controls the gain setting of the first amplifying 91-97 unit and the second amplifying unit 99. The first amplifying unit has a gain variable range necessary to amplifying the input signal to the prescribed desired level. The second amplifying unit has a gain variable range narrower than that of the first amplifying unit. When the gain controller changes the gain setting, the gain controller uses the second amplifying unit preferentially over the first amplifying unit.

13 Claims, 13 Drawing Sheets

AMPLIFYING DEVICE AND ITS CONTROL METHOD

INCORPORATION BY REFERENCE

This application is based upon and claims the benefit of priority from Japanese patent application No. 2009-089877, filed on Apr. 2, 2009, the disclosure of which is incorporated herein in its entirety by reference.

BACKGROUND

1. Field of the Invention

The present invention relates to an amplifying device and its control method.

2. Description of Related Art

In FIG. 11, there is disclosed a general configuration of an intermediate frequency (hereinafter called IF) type receiver 11 for digital TV. An RF signal received by an antenna (not shown in the figure) is input to an input terminal 1, amplified by a low noise amplifier (hereinafter called LNA) 2 and down-converted by a down-conversion-mixer 3. The frequency of a local signal input from a local signal input terminal 4 to the down-conversion-mixer 3 is set to a frequency that is higher than the carrier frequency of a desired RF signal by the intermediate frequency.

An IF signal output from the down-conversion-mixer 3 is converted to a digital signal through a low pass filter (LPF) 5 for selecting a channel, a gain variable amplifier 6 and an analog/digital converter (ADC) 7. The converted digital signal is down-converted to a signal frequency IQ by an IQ mixer 8, and processed by a base band (BB) signal processor 9. Further a gain setting unit 10 controls the gain of the LNA 2 and the gain variable amplifier 6 depending on the time slot, bit error rate, received signal strength and the like of the received signal.

In the IF type receiver mentioned above, the down-conversion to an IF signal by the down-conversion mixer 3 is performed before filtering out signal components other than the channel signal. Considering the existence of disturbing waves, therefore, enough gain cannot be gained at the stage preceding the down conversion mixer 3. Thus, the strength of a desired component of IF after the down-conversion is generally weak. The gain of the gain variable amplifier 6 needs to be adjusted so that the range of the weak desired component conforms to the dynamic range of ADC 7. Here, examples of the desired properties of the gain variable amplifier 6 include a wide gain variable range and a wide input dynamic range.

Now two types described below are well known as a gain variable amplifier 6. One type is a valuable gain amplifier (hereinafter called VGA) type which changes gain continuously depending on the control voltage. Another type is a programmable gain amplifier (hereinafter called PGA) type which changes gain stepwise by logic control.

In FIG. 12, there disclosed a typical circuit diagram of the valuable gain amplifier (VGA). The circuit disclosed in FIG. 12 divides a signal current from transistors Q1, Q2 into a current to transistors Q3, Q4 and a current to transistors Q3, Q4. Its division ratio changes depending on the control voltage and, as a result, the gain of the circuit is changed. The gain property changes depending on temperature and variations in the manufacturing process, and therefore these changes should be taken into consideration in the circuit design because the gain of this circuit is controlled by the properties themselves of the transistors in the circuit scheme shown in FIG. 12. Further the circuit has such problems that when a level of input signal is high, the output signal would be distorted, and that the maximum output level is low because it is difficult to achieve high gain in the circuit Next, in FIG. 13, there disclosed a typical circuit diagram of the programmable gain amplifier (PGA). The circuit disclosed in FIG. 13 produces a gain by the cascade connection of a plurality of inverted amplifier circuits of an operational amplifier (OP-Amp). The gain of an amplifier circuit A1 at the first stage is determined by the ratio of an input resistor R11 to feedback resistors R12, R13. For instance, in the case that R12=R11, R13=39.81×R11 and the gain selection switch S11 connects to the R12 side, the gain of the amplifier circuit A1 becomes zero because R12/R11=1. Further, in the case that the selection switch S11 connects the R13 side, the gain of the amplifier circuit A1 becomes 32 dB because R13/R11=39.81. Therefore the amplifier circuit A1 becomes a gain changeable amplifier by switching gain selection switch S11 wherein the amplifier circuit A1 may take the gain value of 0 dB and 32 dB.

As mentioned above, the gain of an amplifier circuit is determined by the ratio of an input resistor to feedback resistor when the gain of each operational amplifier (Op-Amp) itself is sufficiently high.

In FIG. 14, there disclosed a differential amplifier circuit as a programmable gain amplifier which does not include an operational amplifier (Op-Amp). The gain of this circuit is determined by the following equation. $(R1 \times (R2+2 \times R3))/(R2 \times 2 \times R3)$.

Therefore the gain of the differential amplifier circuit can be determined only by the ratio of the resistors. Variations of resistors in a one integrated circuit can be kept below several percents by using current semiconductor manufacturing technology, so those amplifier circuits disclosed in FIGS. 13 and 14 can produce a stable gain. Further, those amplifier circuits disclosed in FIGS. 13 and 14 have a good distortion property because they form a feedback circuit, and the maximum output level can be maintained roughly constant regardless of the gain setting.

In FIG. 13, an amplifier circuit in the second stage is composed of an Op-Amp A21, an input resistor R21, feedback resistors R22, R23, and a gain selection switch S21; an amplifier circuit in the third stage is composed of an Op-Amp A31, an input resistor R31, feedback resistors R32, R33 and a gain selection switch S31. Amplifier circuits in the fourth and subsequent stages can be formed similarly. Here, the feedback resisters of each of the amplifier circuits (A1, A2, ...) are set so that each amplifier circuit has a respective one of amplification gains from 1 dB to (n-th power of 2) dB (n=0, 1, 2, 3, 4, 5 and 6). Then, the total gain of the amplifying device can be set to any value between 1 dB and 64 dB in increments of 1 dB by selectively controlling the gain selection switchs S11-S61.

As mentioned above, the gain of a PGA type amplifying device can be set by the ratio of resistors. However, the actual circuits include the on-resistance (Rs) of the gain selection switches. In the actual circuit of FIG. 13, there are on-resistances (Rs); R12'=R12+Rs11, R13'=R13+Rs11. Likewise, in the actual circuit of FIG. 14, there are also on-resistances (Rs); R3'=R3+Rs÷2.

These on-resistances of such switches vary significantly from a fraction to several ten-fold depending on temperature, bias conditions and variations in the manufacturing process In the case of low gain setting, on-resistances do not cause the problem because the on-resistances are sufficiently low compared to the feedback resistance and emitter resistance. However, on-resistances give an effect on gain in the case of high gain setting because the feedback resistance and emitter resistance became low under the condition. Therefore, in this case, the designed gain value cannot be achieved.

Here, we describe control data and gain setting in the specification of the present application. In the specification, we define "0" as low gain setting and "1" as high gain setting. For example, in FIG. 15, "A=010111" means that an amplifier 51 and an amplifier 53 are set as low gain, and an amplifier 52 and amplifiers 54-57 are set as high gain. In FIG. 15, each of the amplifiers 51-57 is set so as to have a respective one of amplification gains from 0.5 dB to (n-th power of 2) dB (n=0, 1, 2, 3, 4, 5, 6 and 7), and the amplifiers 51-57 are connected in series. In FIG. 15, a two-state amplifier 51 whose gain can be switched between 0 dB and 32 dB is represented as (0/32+ α). This expression clearly shows that since the amplifier 51 has high gain, the amplifier 51 tends to be strongly affected by a switching resistance and the like and the deviation from the set value (32 dB in this case) thereby becomes comparatively noticeable.

Conventional, PGAs disclosed in FIG. 13 and FIG. 15 tends to produce gain errors caused by properties and the layouts of circuit elements included in each of the amplifiers. These gain errors emerge significantly at the time of all-bit inversion, for example, when the gain setting is changed from A=0111111 to A=1000000. In FIG. 16, there disclosed a gain change which occurs when the total gain setting of amplifying device gradually increases. FIG. 17 is a magnified view of the gain change at the time of all-bit inversion in FIG. 16.

As shown in FIG. 16, when the total gain setting increases gradually, the accumulated gain error becomes so large that it cannot be ignored. When the gain error becomes so large that it cannot be ignored compared to gain step of the PGA, the linearity of overall gain change of the amplifying device cannot be maintained as shown in FIG. 17. In FIG. 17, when the gain changes from 31.5 dB (A=0111111) to 32 dB (A=1000000), the gain error α of the amplifier 51 becomes too large to be ignored, and gain adjustment of 0.5 dB cannot be properly performed. Further, after that, it draws a nonlinear gain characteristic curve including the gain error α. Furthermore, in cases other than the all-bit inversion, a similar problem also occurs when more than a certain number of bits are inverted, for example, when the gain setting is changed from A=0011111 to A=0100000.

If the gain does not change linearly, a gain control circuit repeats gain-up and gain-down control to achieve the optimal gain because it cannot achieve designed gain. This makes it impossible to stabilize the signal level, so the signal processing becomes impossible. Therefore, it is necessary for the PGA to have a circuit system that can maintain the linearity of gain change in order to make the signal processing possible.

Here, we describe the art disclosed in Japanese Unexamined Application Publication No. 11-251851 (Patent Document 1) as a related art. A gain control amplifying device disclosed in the Patent Document 1 has a configuration in which a plurality of amplifiers are connected in series, as is similar to the configurations disclosed in FIGS. 13 and 15. But each amplifier has the configuration shown in FIG. 18 so that on-resistances of gain selection switches do not give an effect on the gain setting. The gain is controlled by on-off switching of the two amplifiers connected in parallel and the switch to change negative feedback line of Op-Amp is eliminated.

We describe the configuration and its circuit behavior shown in FIG. 18. A first differential amplifier 81 includes transistors Q9 and Q10, and emitters of the transistors Q9, Q10 are connected to the collector of a transistor Q18 for constant current source. A second differential amplifier 82 includes transistors Q11 and Q12, and emitters of the transistors Q11, Q12 are connected to the collector of a transistor Q20 for constant current source. An input signal input from an input terminal is supplied to the bases of transistors Q9, Q12 via resistors R4, R5. The collectors of transistor Q9, Q12 are connected to the collector of transistor Q13, and the collectors of transistors Q10, Q11 are connected to the collector of transistor Q14.

Transistors Q13, Q14 forms a current mirror circuit 83 in which the transistor Q13 serves as the input side and a power-supply line serves as a reference potential point. Assuming that R4=R5, differential amplifiers 81 and 82 are connected in parallel.

The collector outputs of transistors Q10, Q11 and Q14 are supplied to the bases of output transistors Q15, Q16 via a drive circuit. Push pull output of transistors Q15, Q16 is output to the output terminal. Further negative feedback resistances R6, R7 are connected between the output terminal and transistors Q9, Q12.

A switch circuit to control ON/OFF switching of the two differential amplifiers 81, 82 is composed of current mirror circuits 84 and 85. A current mirror circuit 84 is composed of transistors Q17-Q19 in which the transistor Q17 serves as the input side and a ground potential serves as a reference potential point. The base of the transistor Q17 is connected to a gain control terminal. A current mirror circuit 85 is composed of transistors Q20, Q21 in which transistor Q21 serves as the input side and a ground potential serves as a reference potential point. A predetermined current is supplied to a transistor Q21 through a resistor R8. The collector of the transistor Q19 is connected to the transistor Q21.

In the above-mentioned configuration, because the transistor Q17 is turned on when the gain control terminal is "H". As a result, a transistor Q18 is turned on, and the transistors Q17, Q18 operate as the differential amplifier 81 in which transistor Q18 serves as the constant current generator. On the other hand, when a transistor Q17 is turned on, because transistor Q19 is also turned on, the transistor Q20 is turned off. As a result, neither transistor Q11 nor Q12 work as the differential amplifier 82. The gain at this time is determined by the ratio of resistances R6 and R4.

When the gain control terminal is "L" level, because the transistor Q17 is turned off, the transistor Q18 is turned off. As a result, neither transistor Q9 nor Q10 work as the differential amplifier 81. On the other hand, when transistor Q17 is turned off, because transistor Q19 is turned off, the transistor Q20 is turned on. As a result, transistor Q11 and Q12 work as the differential amplifier 82 in which transistor Q20 serves as a constant current source. The gain at this time is determined by the ratio of resistances R5 and R7.

Further, as a method of maintaining the linearity of the overall gain of the amplifying device, it is conceivable to combine overlapping the range of gain change for each amplifier with the control technique. The gain setting of each amplifier is made to overlap over other amplifiers and the gain control has such a hysteresis that the gain change followsconforms to a gain-up line shown in FIG. 19 when the gain increases and followsconforms to a gain-down line shown in FIG. 19 when the gain decreases. This setting makes it possible to maintain the linearity of the overall gain of the amplifying device. In FIG. 19, the gain setting has an overlap over a point where all-bit inversion from A=0111111 to A=1000000 occurs. The overlapping of gain setting like his is set for other bit inversions (e.g. from A=0011111 to A=0100000). However, as the number of gain overlapping increases, this method needs to increase the number of stages of the amplifiers to cover desired range of a variable gain. This causes the problem such as the expansion of the chip area and an increase of current consumption.

Further, in Japanese Unexamined Application Publication No. 2003-158435 (Patent Document 2), there disclosed such a configuration that the gain change of the amplifying device is made to be linear, and both of design complexity and high costs design are avoided by narrowing the input dynamic range required for the amplifying device. In the Patent Document 2, a variable attenuator is provided between an input terminal and a variable gain amplifier. When gain is adjusted, not only the variable gain amplifier but also the variable attenuator are controlled at the same time. This makes the variable gain range of the variable gain amplifier narrower. Further, the circuit design for linearity adjustment is made easier because the dynamic range of peripheral circuits after the variable attenuator are made narrower. And in the Patent document 2, when the gain of the gain variable amplifier is controlled, a gain coarse-adjustment control signal and a gain fine-adjustment control signal are used, where the gain fine-adjustment control signal is used to make fine adjustments to the gain coarse-adjustment control signal by feedback control.

In Japanese Unexamined Application Publication No. 2002-353756 (Patent document 3), there disclosed such a gain control method that the AGC characteristic curve of the AGC amplifier is interpolated by linear interpolation method. However, the linear interpolation method cannot work properly in the case that the AGC characteristic curve is very steep. In addition, it takes a lot of trouble to adjust a plurality of AGC amplifiers required to obtain a large gain. Thus, when creating linear interpolation tables based on the AGC character of each of a plurality of AGC amplifiers, the linear interpolation table of one AGC amplifier is composed so that the excess and deficiency of the gain of another AGC amplifier is compensated. For example, the first AGC amplifier and the second AGC amplifier are actually combined. Then, while measuring the transmitting power value (output electric power value), a DAC code is determined so that analog variations can be mutually absorbed. Thus, approximation is improved even in the area where the gain-control voltage character curve of the AGC amplifier is steep, and as a result, the dynamic range of the AGC amplifier can be used effectively.

SUMMARY

Certainly, in the case of the configuration disclosed in the Patent Document 1 shown in FIG. 18, because the switch resistance has no influence, the gain setting of each amplifier (operational amplifier) can be set according to the predetermined design and the linearity of the overall gain of the amplifying device is thereby maintained. However, the present inventors have found a problem that the number of the differential amplifiers is doubled and the chip area thereby becomes larger.

Further, in the case of the Patent document 2 in which the signal level is attenuated by the variable attenuator, the configuration can be applied when an input signal level is sufficiently high, but the configuration is inappropriate to amplify an originally low level input signal by a large amount. Moreover, the fine-adjustment signal, in addition to the coarse-adjustment signal, is generated through the feedback control and the variable gain amplifier is thereby fine-adjusted. However, it is impossible to achieve the desired gain no matter how many times the fine-adjustment is repeated when the variable gain amplifier itself has an error from the design values. The feedback control could oscillate in the worst case, and goes out of control.

In the case of patent document 3, it is required to evaluate each characteristic of two or more AGC amplifiers beforehand, combine them, and determine the control voltage to maintain linearity. The required time and efforts are so much, and the adjustment is very difficult. In addition, it is substantially impossible to carry out such work for each of the actual product devices.

A first exemplary aspect of the present invention is an amplifying device that amplifies an input signal of which a signal level varies to a prescribed desired level and outputs the amplified signal, the amplifying device comprising:

a first amplifying unit capable of changing its gain in a stepwise manner;

a second amplifying unit cascade-connected to the first amplifying unit, the second amplifying unit being capable of changing its gain in a stepwise manner; and a gain controller that controls the gain setting of the first amplifying unit and the second amplifying unit, wherein the first amplifying unit has a gain variable range necessary to amplifying the input signal to the prescribed desired level, the second amplifying unit has a gain variable range narrower than that of the first amplifying unit, and when the gain controller changes the gain setting, the gain controller uses the second amplifying unit preferentially over the first amplifying unit.

The amplifying device in accordance with the present invention comprises the second amplifying unit of which the gain variable range is narrow, in addition to the first amplifying unit. The gain variable range of the second amplifying unit is set to a narrow range. Therefore, the gain error of the second amplifying unit can be made smaller. Further, by using the second amplifying unit preferentially over the first amplifying unit, the frequency of the change of the gain of the first amplifying unit, which could have a relatively large gain error, is reduced. As a result, the linearity of the overall gain of the amplifying device can be maintained.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

With reference to the accompanying drawings, exemplary embodiments of the present invention will be described.

First Exemplary Embodiment

Figure 1:
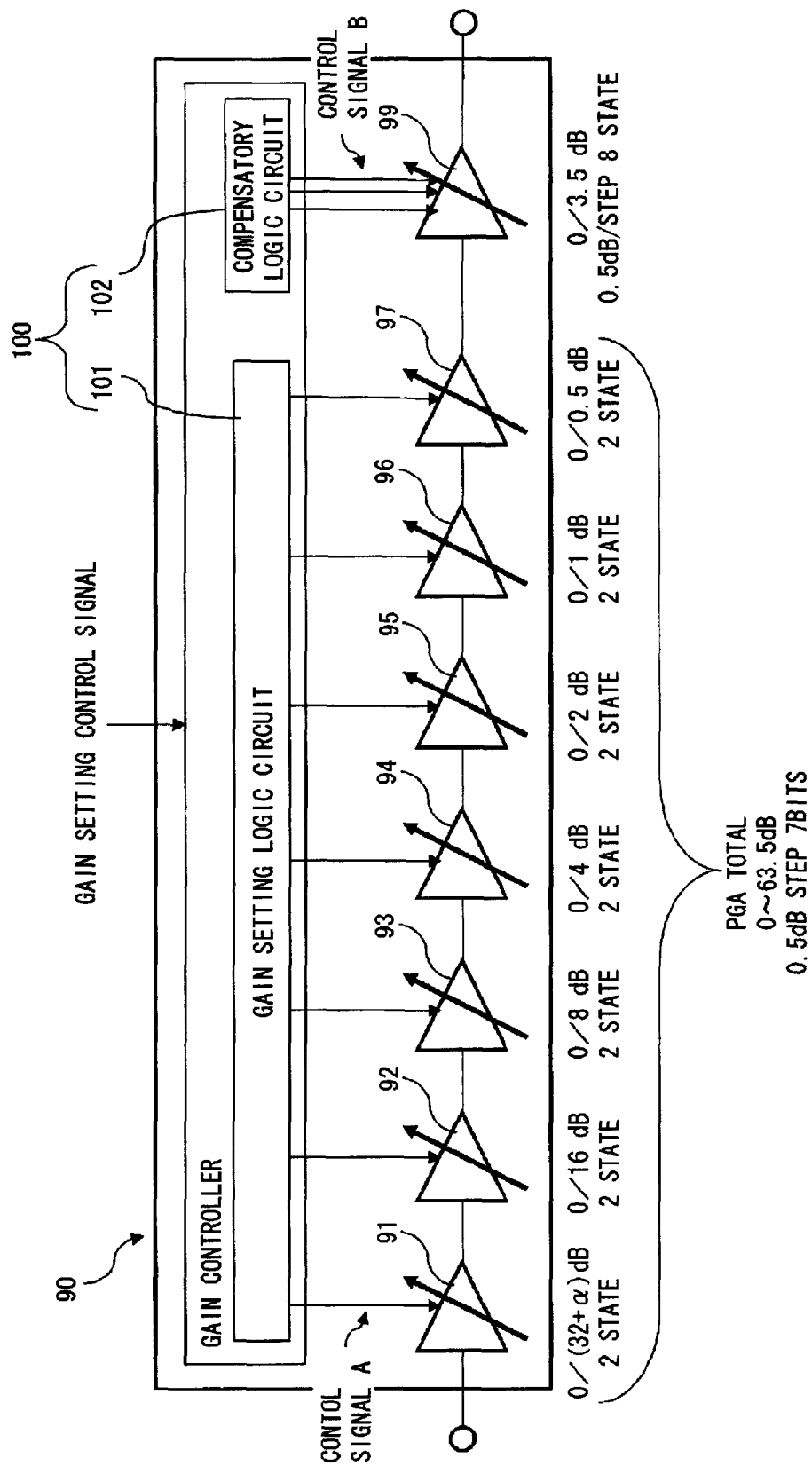
FIG. 1 is a diagram showing a configuration of an amplifying device according to a first exemplary embodiment of the present invention.

In FIG. 1, there is disclosed a configuration of a first exemplary embodiment.

In the first exemplary embodiment, gain setting can be made between the minimum 0 dB to the maximum 63.5 dB in increments of 0.5 dB.

An amplifying device 90 of the first exemplary embodiment comprises seven two-state amplifiers 91-97, a compensatory amplifier 99 and a gain controller 100.

The seven two-state amplifiers 91-97 are set as follows:
The two-state amplifiers 91: 0 dB/32 dB;
The two-state amplifiers 92: 0 dB/16 dB;
The two-state amplifiers 93: 0 dB/8 dB;
The two-state amplifiers 94: 0 dB/4 dB;
The two-state amplifiers 95: 0 dB/2 dB;
The two-state amplifiers 96: 0 dB/1 dB; and
The two-state amplifiers 97: 0 dB/0.5 dB.

In FIG. 1, the two-state amplifiers 91: 0 dB/32 dB is represented as 0/(32+α) dB. This expression clearly shows that since the amplifier 91 has high gain, the amplifier 91 tends to be strongly affected by a switching resistance and the like and the deviation from the set value (32 dB in this case) thereby becomes comparatively noticeable.

Here, the amplifiers 91-97 constitute a first amplifying unit which changes its gain in a stepwise manner. Further, this first amplifying unit has again range necessary to amplify an input signal to a desired level.

The compensatory amplifier 99 is eight-state amplifier which changes gain between 0 dB to 3.5 dB at increments of 0.5 dB. The gain setting range of the compensatory amplifier 99 is narrower than that of the first amplifying unit, and the maximum value of the gain setting is lower than that of the first amplifying unit. In the compensatory amplifier 99, an on-resistance Rs of a selection switch is sufficiently low compared to a resistance that determines gain. Therefore, the compensatory amplifier 99 can set gain with a high degree of accuracy. Further, the increment of each gain variable step of the first amplifying unit (amplifiers 91-97) is equal to that of the compensatory amplifier 99.

Here, the compensatory amplifier constitutes a second amplifying unit.

The two-state amplifiers 91-97 and the compensatory amplifier 99 are cascade-connected.

In this embodiment, we describe the example in which the increment of each gain variable step of the first amplifying unit (amplifiers 91-97) is equal to that of the compensatory amplifier 99; however, it is preferred that the increment of each gain variable step of the compensatory amplifier (the second amplifying unit) is made to be equal to or lower than that of the first amplifying unit (amplifiers 91-97). Further, we describe the example in which the setting range of the first amplifying unit (amplifiers 91-97) is seven bits from 0 dB to 63.5 dB at intervals of 0.5 dB, and that of the compensatory amplifier (the second amplifying unit) 99 is three bits from 0 dB to 3.5 dB at intervals of 0.5 dB. However, the gain range and the gain interval of the first amplifying unit (amplifiers 91-97) can be varied depending on the requirements for the amplifying device 90. Moreover, the gain range of the compensatory amplifier (the second amplifying unit) 99 can be varied as long as the difference from the desired value is not excessively large.

The gain controller 100 comprises a gain setting logic circuit 101 for controlling the gain of the two-state amplifiers 91-97, and a compensatory logic circuit 102 for controlling the gain of the compensatory amplifier 99. Now we represent a gain control signal output from the gain setting logic circuit 101 as "A" Here, "A" is a seven bit control signal (A=(A1, A2, A3, A4, A5, A6 and A7)). Further, we represent a gain control signal output from the compensatory logic circuit 102 as "B". Here, "B" is a three bit control signal (B=(B1, B2 and B3)). The relation between the "B" and gain setting of the compensatory logic circuit 102 is set as shown in the table 1. As an initial state, the gain control signal "A" is set to a given value and the gain control signal "B" is set to the center (B=100) of its variable gain range.

TABLE 1

| B1 | B2 | B3 | GAIN |
|----|----|----|------|
| 0  | 0  | 0  | 0 dB |
| 0  | 0  | 1  | 0.5 dB |
| 0  | 1  | 0  | 1.0 dB |
| 0  | 1  | 1  | 1.5 dB |
| 1  | 0  | 0  | 2.0 dB |
| 1  | 0  | 1  | 2.5 dB |
| 1  | 1  | 0  | 3.0 dB |
| 1  | 1  | 1  | 3.5 dB |

The gain control signal "A" is a seven-bit signal and the gain control signal "B" is a three-bit signal in this first exemplary embodiment. However, the gain control signal "A" and "B" is can be varied depending on requirements for the gain range and gain interval of the amplifiers 91-97 and 99.

A signal received by an antenna (not shown in figures) is input from an input terminal, amplified to a desired signal level through the amplifying device 90, and output from an output terminal. Usually, the strength of the television signal input from the antenna constantly varies due to the disturbance. Therefore, the amplifying device 90 changes the gain setting so that the baseband signal input to ADC which is provided at a latter stage (not shown in figures) invariably has a constant intensity.

Figure 2:
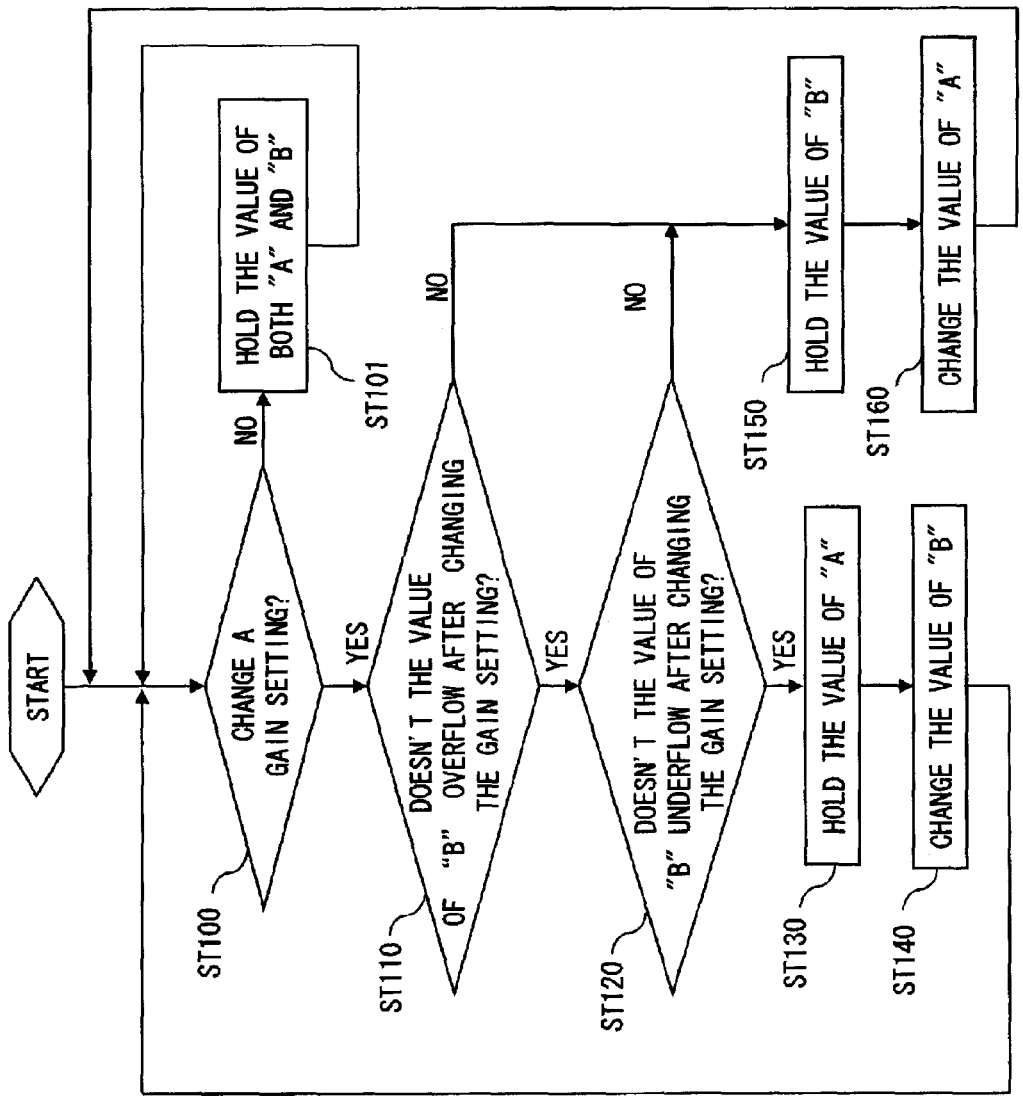
FIG. 2 is a flowchart showing an operational procedure of a gain controller according to the first exemplary embodiment.

When the gain setting is changed, the gain controller 100 operates according to a flowchart of FIG. 2. The gain controller 100 receives a gain setting control signal, determines whether to change the gain setting of the amplifier 91-97 and 99 (ST100).

In the case of changing the gain setting (ST100: YES), the control signal "A" and "B" are changed as follows. It is important that the gain controller 100 changes the gain setting of the compensatory amplifier 99 preferentially. That is, the gain controller 100 determines whether the control signal "B" given to amplifier 99 would overflow or not when the gain is changed from the current setting (ST110).

In the case that the gain control signal "B" will not overflow when the gain is changed (ST110: YES), then, it is determined whether the gain control signal "B" would underflow when the gain is changed (ST120). In the case the gain control signal "B" will not underflow when the gain is changed (ST120: YES), the control signal "A" which is supplied to the amplifiers 91-97 is maintained (ST130) and the gain of the amplifying device is changed by changing the control signal "B" and the changing the gain setting of the compensatory amplifier 99. (ST140).

On the other hand, if the gain control signal "B" would overflow or underflow with respect to the desired gain setting (ST110, ST120: NO), the gain control signal "A" is changed so as to become the optimal value with respect to the desired gain setting (ST160). In this case, the control signal "B" is left unchanged (ST150), that is, the gain of amplifying devise is changed without changing the gain of the compensatory amplifier 99.

Figure 3:
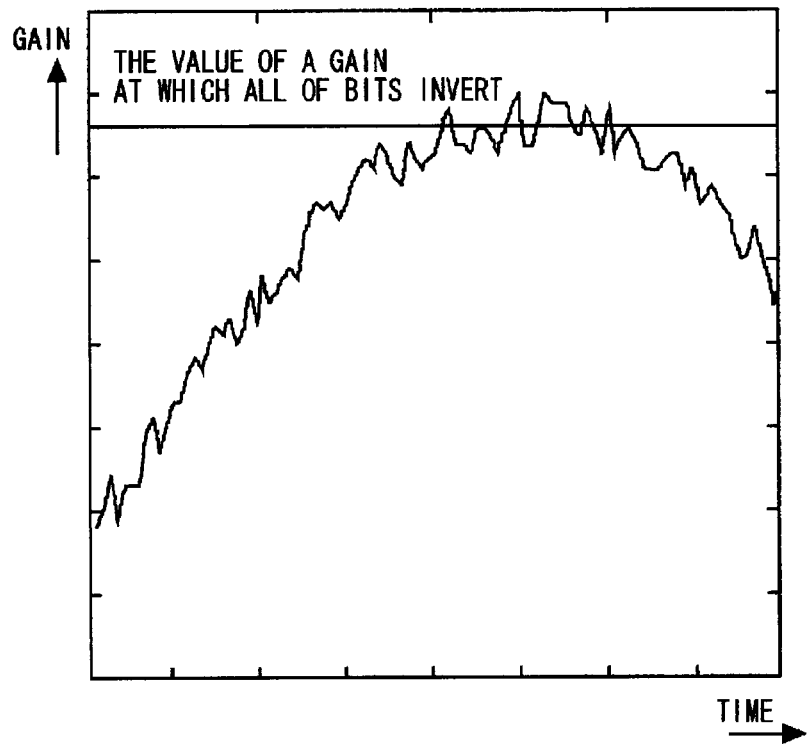
FIG. 3 is an example of a gain variation of the circuit disclosed in FIG. 15.
Figure 15:
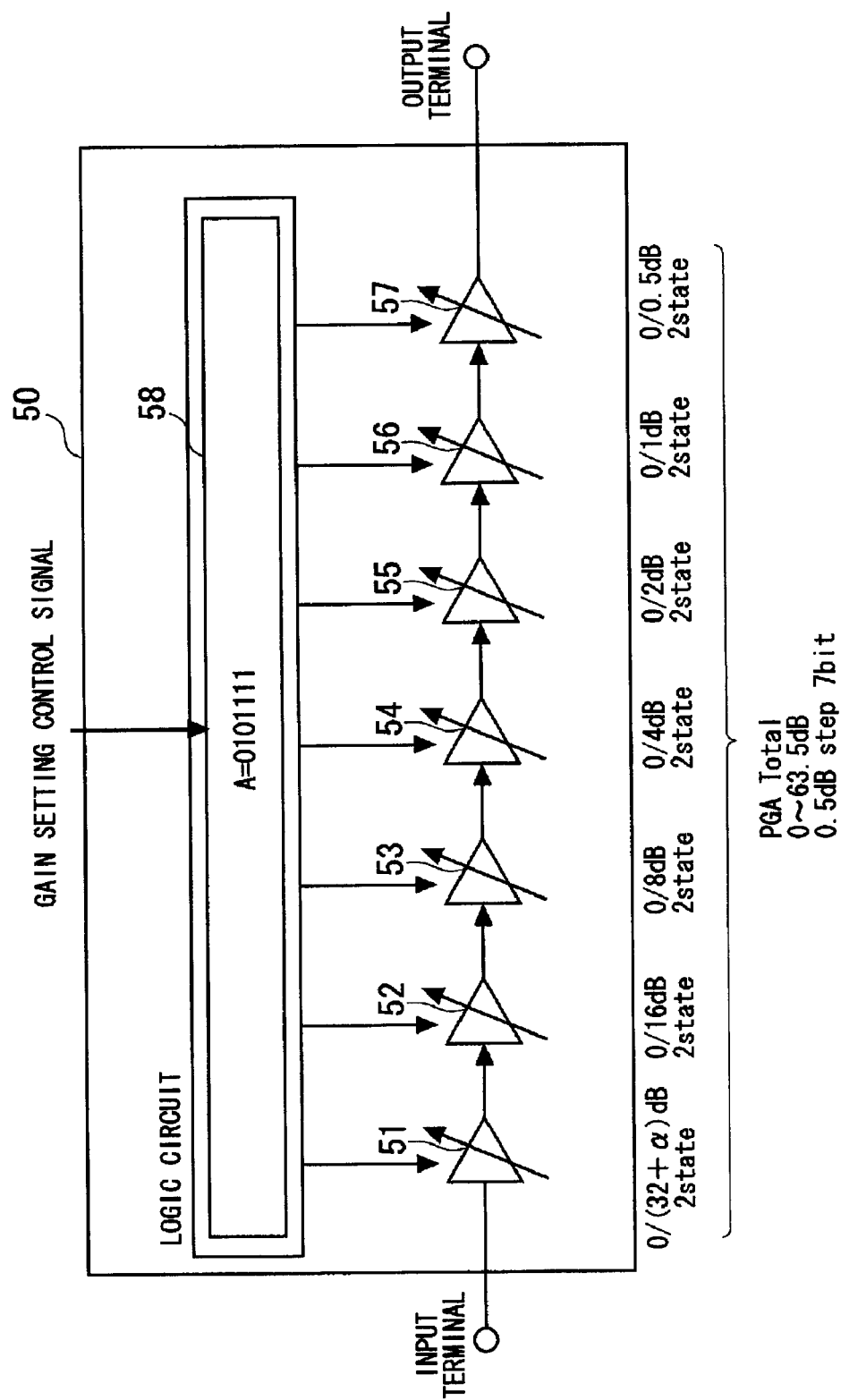
FIG. 15 is a typical circuit diagram in which two-state amplifiers are connected in series as a related art.
Figure 16:
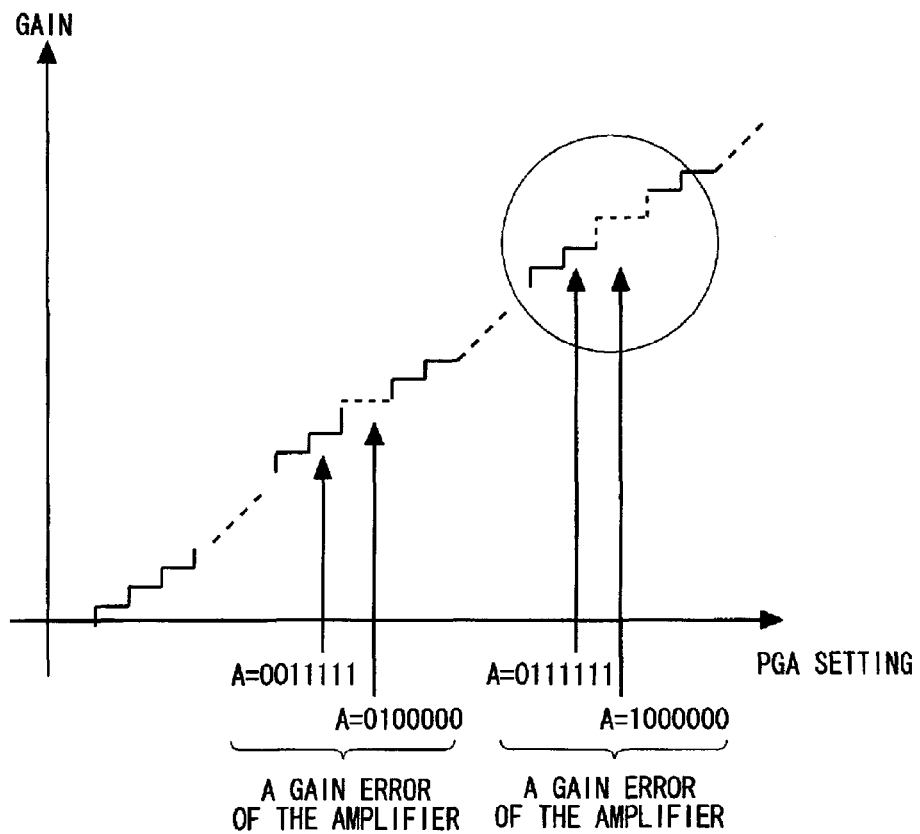
FIG. 16 illustrates an example of gain change which occurs when total gain setting of an amplifying device gradually increases as a related art.
Figure 17:
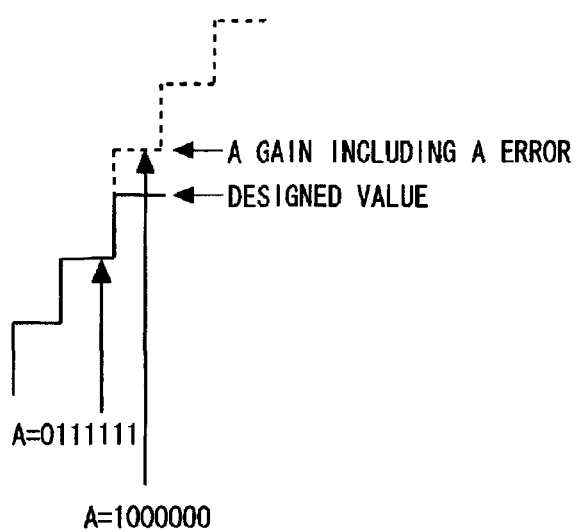
FIG. 17 is a magnified view of the gain change at the time of all-bit inversion in FIG. 16.
Figure 18:
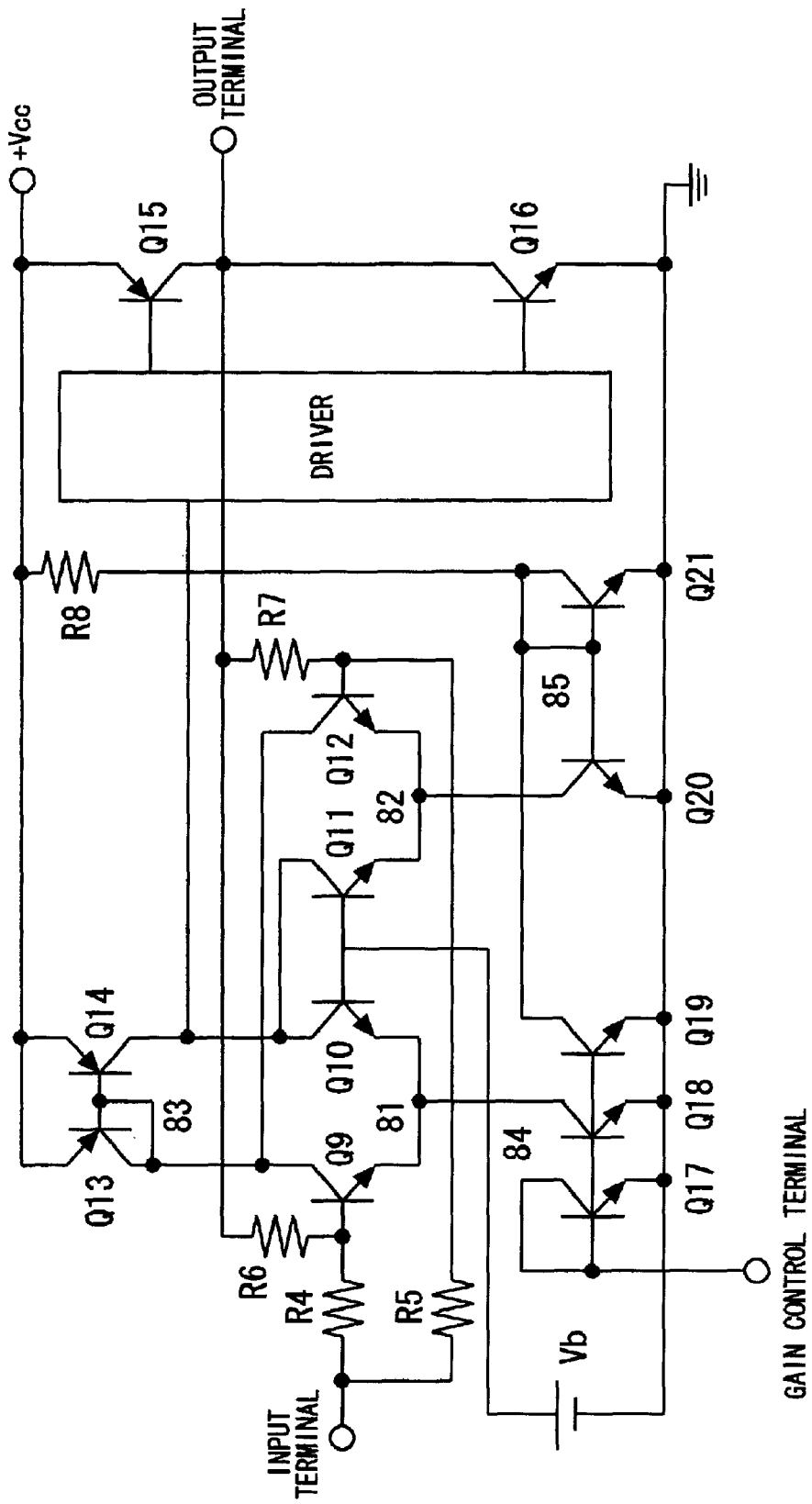
FIG. 18 is a configuration disclosed in the Patent Document 1.
Figure 19:
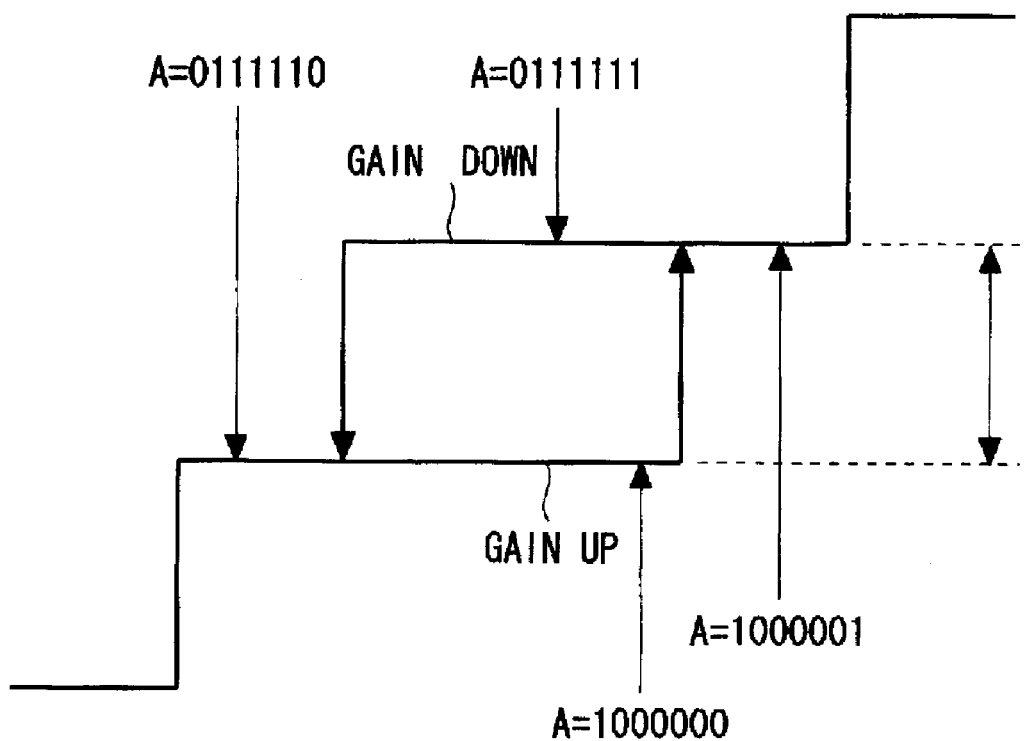
FIG. 19 illustrates the case that gain settings of each amplifier is made to overlap with other amplifiers.

Next, the operation and effect of the first exemplary embodiment is explained in comparison with the related art disclosed in FIG. 15. In FIG. 3, there is disclosed an example of a gain variation of the circuit disclosed in FIG. 15. Amplifiers 51-57 change their gain setting very frequently in order to output a constant level signal. In this configuration, all-bit inversion is required when the gain setting exceeding the all-bit inversion is demanded. For example, in the FIG. 15, all-bit inversion is required in the case where the gain is to be changed from 31.5 dB to 32 dB. Here, all-bit inversion such as a setting change from A=0111111 to A=1000000, the deviation from the design value of each amplifier will have a significant influence. Thus the circuit tends to oscillate or go out of control because keeping the linearity of the control is difficult.

Figure 4:
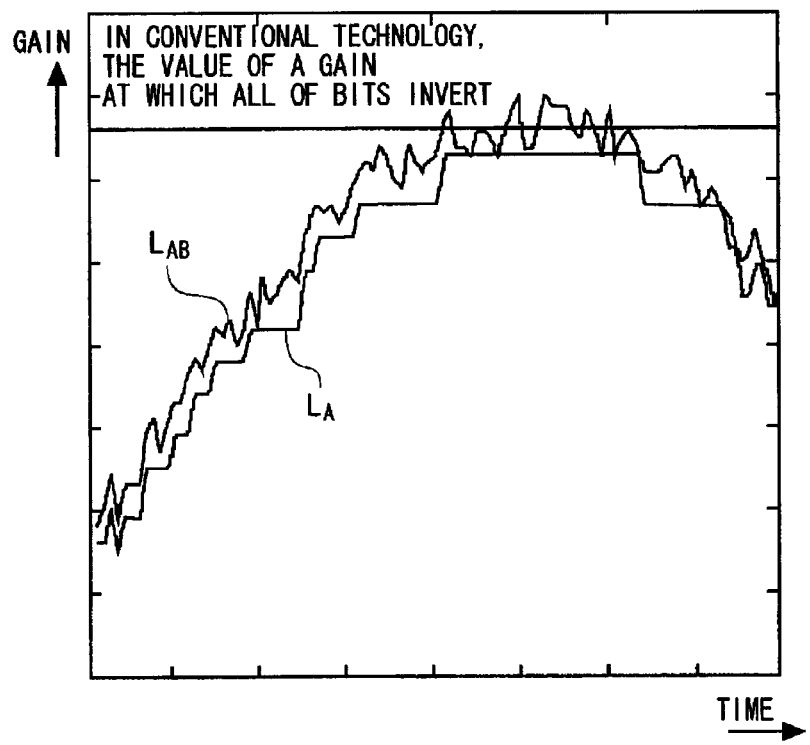
FIG. 4 is an example of a gain variation of the amplifying device according to the first exemplary embodiment.

In contrast, in FIG. 4, there is disclosed an example of a gain variation of the amplifying device 90. In FIG. 4, a line $L_{AB}$ represents the total gain of amplifying device 90 and a line LA represents the gain of the amplifiers 91-97 which is controlled by the gain setting logic circuit 101. As shown by the line LA of FIG. 4, the number of gain changing operations of the amplifiers 91-97 is less than that of the related art. Further, even for the gain setting that would require all-bit inversion in the case of the related art, the desired gain can be achieved by operating only the compulsory amplifier 99 without performing the all-bit inversion (refer to the line $L_{AB}$). Further, because the gain setting of the compensatory amplifier 99 is low, an on-resistance Rs of the selection switch is sufficiently low compared to resistances by which the gain is determined. Therefore, the gain of the compensatory amplifier 99 can be set accurately.

According to the first exemplary embodiment, it can considerably reduce the number of times of the bit inversion in which a lot of bits are inverted. As a result, the deviation from the designed value does not have a large influence. Therefore, the gain-setting overlap between amplifiers in an attempt to maintain the linear control, the large size chip area, and the high consumption current can be avoided.

Figure 5:
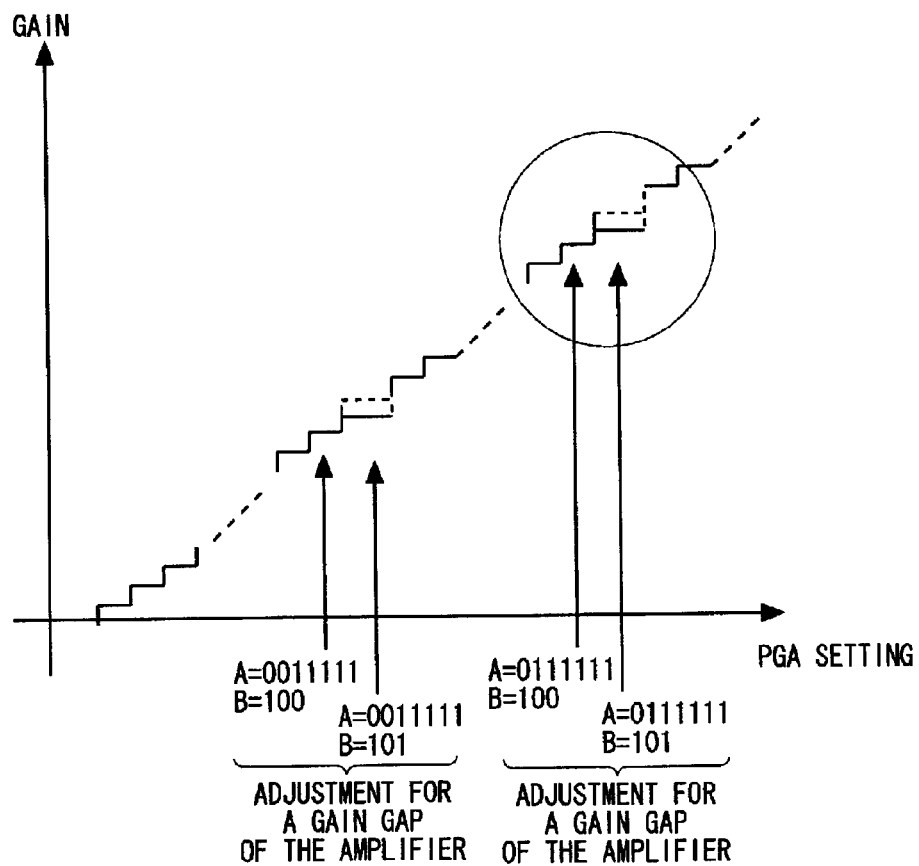
FIG. 5 is an example to explain the operation and effect of the first exemplary embodiment.
Figure 6:
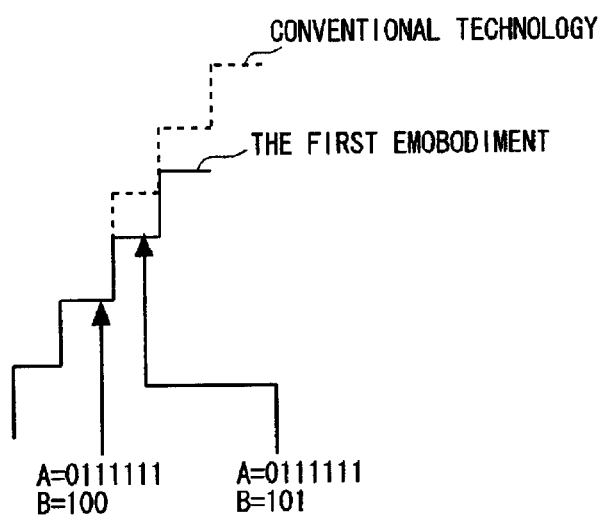
FIG. 6 is an example to explain the operation and effect of the first exemplary embodiment.

Further, the operation and effect of the first exemplary embodiment is explained referring to FIGS. 5 and 6. Here, the actual gain of the amplifier 91 is assumed to be higher than the designed value by α dB. Further, in this specific example, the desired gain at the next time is assumed to be higher than the total gain (A=0111111, B=100) by 0.5 dB.

If simple controlling is to be executed based on desired value, A=1000000 may be obtained by the all-bit inversion. However, because the actual gain of the amplifier 91 is higher than the designed value by α dB, this difference α dB influences remarkably if the all-bit inversion is executed (refer to the related art in FIG. 6). In particular, switch resistances have a large influence because of the large value of gain setting of the amplifier 91, and the difference α dB is thereby not negligible. As a result, the actual gain significantly exceeds the desired gain by the all-bit inversion, so there is danger of falling into the state of the oscillation in which gain-up and gain-down are repeated, and thus going out of control. Thus, desired gain cannot be achieved by a simple all-bit inversion.

According to the first exemplary embodiment, as shown in FIGS. 5 and 6, the combined gain of the amplifiers 91-97 is maintained at A=0111111, and the gain of compensatory amplifier 99 is raised by 0.5 dB by changing the control signal "B" output from the compensatory control logic circuit 102 from B=100 to B=101. Then, amplifying device 90 can achieve desired gain setting.

Because the compensatory amplifier 99 performs a similar operation for the gain error of the amplifiers 92-97, the gain linearity of the amplifying device 90 can be maintained. That is, an accurate fine-tuning can be made by the compensatory amplifier 99 to correct the differences when amplifiers 92-97 contain a deviation from the designed gain, and linearity of the total gain of the amplifying device 90 can be maintained.

Figure 7:
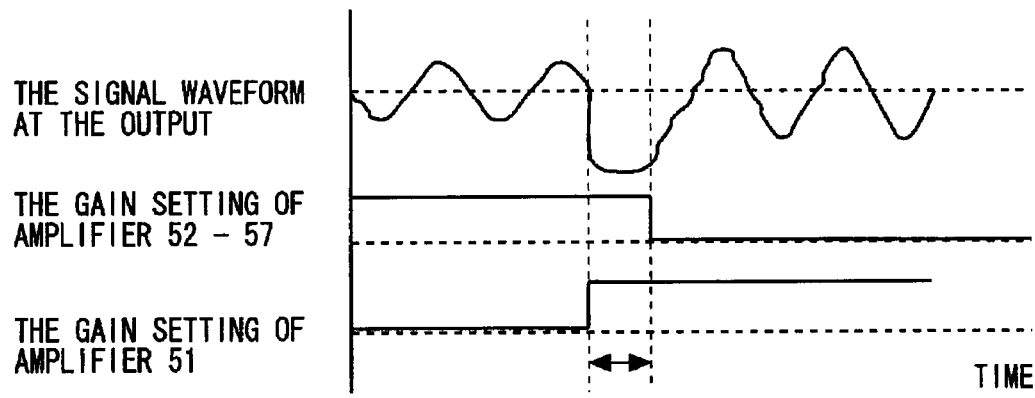
FIG. 7 is an example to show an influence of the skew of the logic circuit at all-bit inversion in the related art.

Moreover, according to the first exemplary embodiment, at the time of all-bit inversion (from A=0111111 to A=1000000), the distortion of the signal waveform can be suppressed. In the related art shown in FIG. 15, at all-bit inversion from A=0111111 to A=1000000, the state of the maximum amplification setting (A=1111111) or the minimum amplification setting (A=0000000) might be momentarily caused by the influence of the skew of the logic circuit. Because the baseband signal is constantly input to the input terminal, the waveform becomes disordered by the influence of the delay of the amplifier, and the accuracy of the output signal is deteriorated. Here, in FIG. 7, in all-bit inversion from A=0111111 to A=1000000, the case where the maximum amplification setting (A=1111111) momentarily occurs by the influence of the skew of the logic circuit was illustrated. When the reverse switching from the amplifier 52 to the amplifier 57 is delayed or the switching of the amplifier 51 occurs early, the maximum amplification setting (A=1111111) is caused. Then, when the maximum amplification setting (A=1111111) occurs, the signal is amplified with the maximum amplification, and the output signal waveform becomes disordered significantly.

Figure 8:
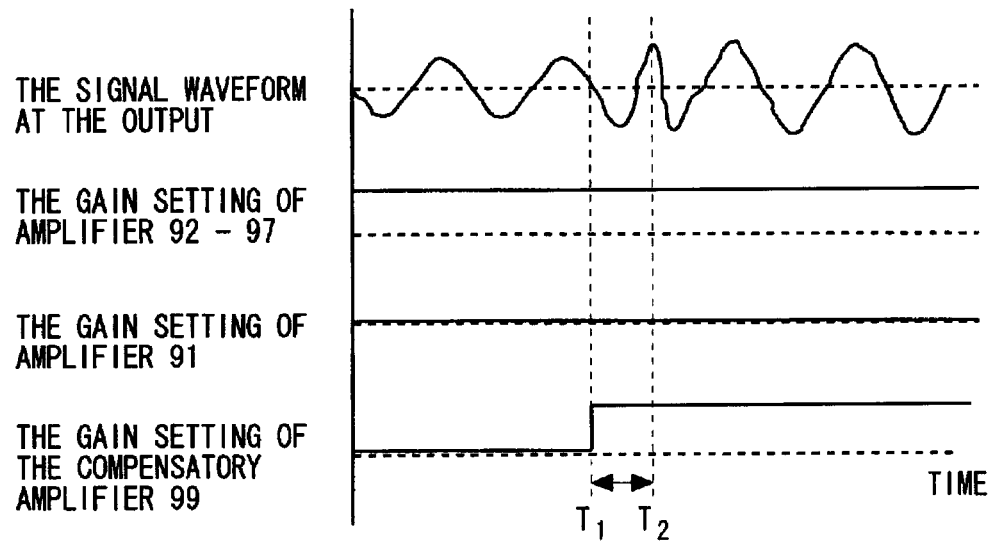
FIG. 8 illustrates the case that the logic skew occurs in the first exemplary embodiment.

According to the first exemplary embodiment, because only the compensatory amplifier 99 is operated by changing the value of the compensatory logic circuit 102, the influence of the gain variation by the skew of logic circuits is small and the accuracy of the baseband signal can be maintained as shown in FIG. 8. For instance, as shown in FIG. 8, in the case that only the compensatory amplifier only 99 is operated by changing the value of the compensatory logic circuit 102, even if the compensatory amplifier 99 changes its gain at timing T1 that is earlier than prescribed switch timing T2, there are only a 0.5 dB gain error during the overlapping period (T1-T2). Therefore, the influence on the output signal waveform is insignificant. Thus, according to the first exemplary embodiment, even if there are logical delays and the like, its influence can be extremely reduced because a bit inversion in which a lot of bits are inverted, like the all-bit inversion, rarely occurs.

Second Exemplary Embodiment

Next, the second exemplary embodiment is explained.

While the basic configuration of the second exemplary embodiment is similar to that of the first exemplary embodiment, the second exemplary embodiment has the feature in that the gain of compensatory amplifier 99 is returned to a prescribed set value when the gains of amplifiers 91-97 (the first amplifying unit) is changed.

Figure 9:
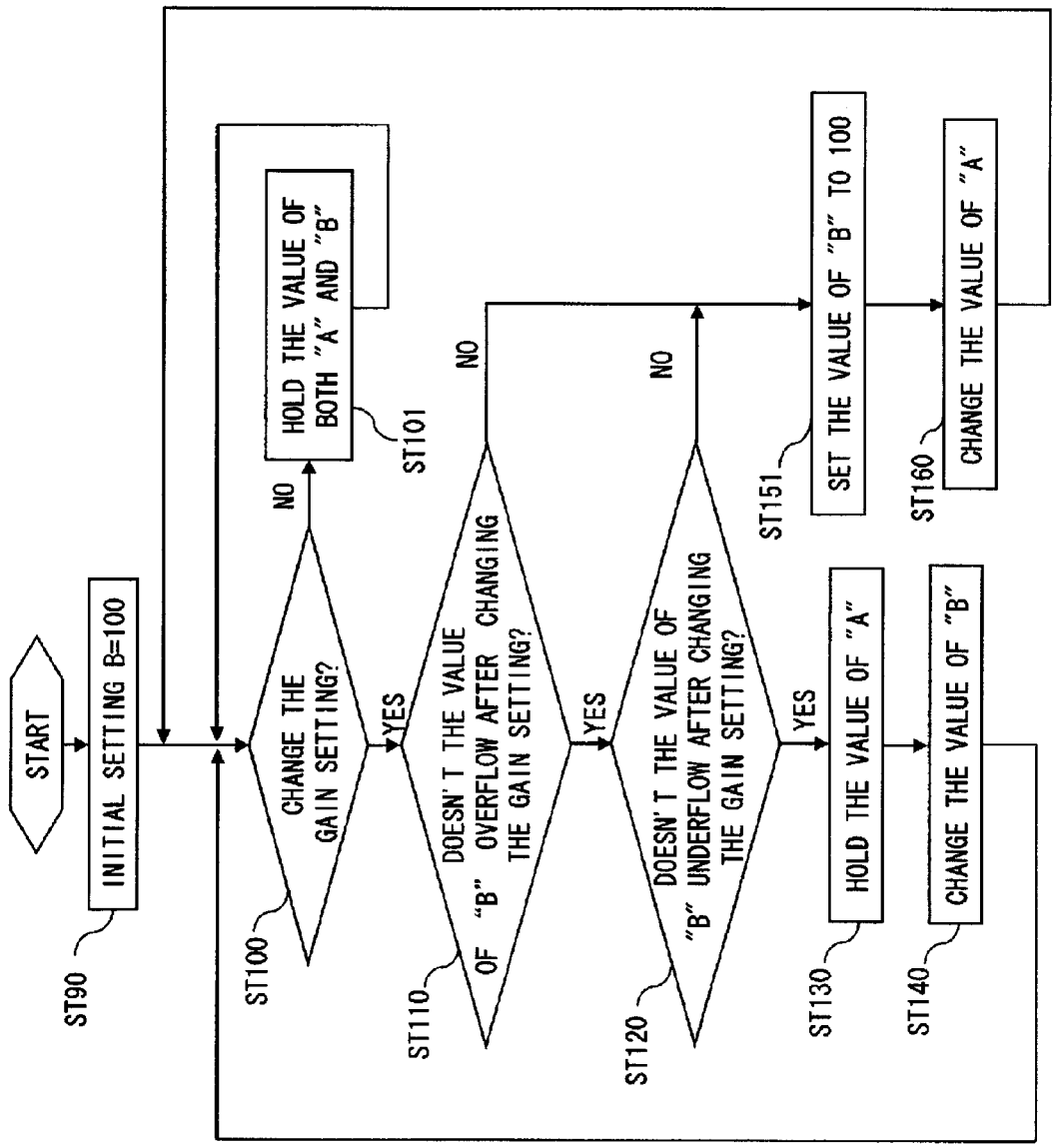
FIG. 9 is a flowchart showing the operation procedure of the gain controller in a second exemplary embodiment.

In FIG. 9, there is disclosed a flowchart which shows the operation procedure of the gain controller in the second exemplary embodiment. The gain control signal "B" of the compensatory logic circuit 101 is set as B=100 as the initial setting (ST90). The gain control signal "A" from the gain setting logic circuit 101 can be set to a given value.

If the value of gain control signal "B" does not overflow or underflow with respect to the desired gain setting (ST110, ST120: YES), the control signal "A" is left unchanged (ST130), and the gain of amplifying device 90 is changed by the compensatory amplifier 99. This point is the same as the above-mentioned first exemplary embodiment.

Here, if the value of the gain control signal "B" overflows or underflows with respect to the desired gain setting (ST110, ST120: NO), the control signal "A" is changed so as to become the optimal value with respect to the desired gain setting (ST160). At this time, in the second exemplary embodiment, the control signal B is returned to the initial value. That is, the gain control signal "B" is returned to B=100.

In the second exemplary embodiment as mentioned above, the step for returning the gain control signal "B" to a prescribed value is incorporated into the control loop. As a result, the gain variable range that can be adjusted by the compensatory amplifier 99 at the next gain setting can be set. For instance, as explained in the above-mentioned, the gain variable range of the compensatory amplifier 99 has the same range for the upper side and the lower side if the control signal "B" is returned to B=100 (ST151). Here, the possibility that the value of "B" overflows rises if the gain of amplifying device 90 is changed upward in a state where the value is maintained in the state of B=111 and B=110. Then, since this upward change can be made only by the gain change using the amplifiers 91-97, the possibility of the occurrence of the all-bit inversion rises even when the necessary adjustment is merely 0.5 dB or 1 dB. To the contrary, according to the second exemplary embodiment, the gain variable range which can be adjusted by the compensatory amplifier 99 is secured. Therefore, the situation in which the gain of amplifying device 90 needs to be adjusted only by the all-bit inversion of "A" becomes less frequent.

Here, as a modified example of the second exemplary embodiment, the control signal B can be reset as B=000 instead of reset as B=100. The gain variable range of the compensatory amplifier 99 can be set only in the upward direction when the "B" is returned to B=000. Alternatively, "B" may be returned to B=111. The gain variable range of the compensatory amplifier 99 can be set only in the downward direction when the "B" is returned to B=111. The returning value of "B" can be varied to the usage of amplifying device 90 and the characteristic of amplifiers 91-97.

Third Exemplary Embodiment

Next, the third exemplary embodiment is explained.

While basic configuration of the third exemplary embodiment is similar to that of the first exemplary embodiment, the third exemplary embodiment has the feature in that the gain of compensatory amplifier 99 is changed to the maximum or minimum value when the gains of amplifiers 91-97 (the first amplifying unit) is changed.

Figure 10:
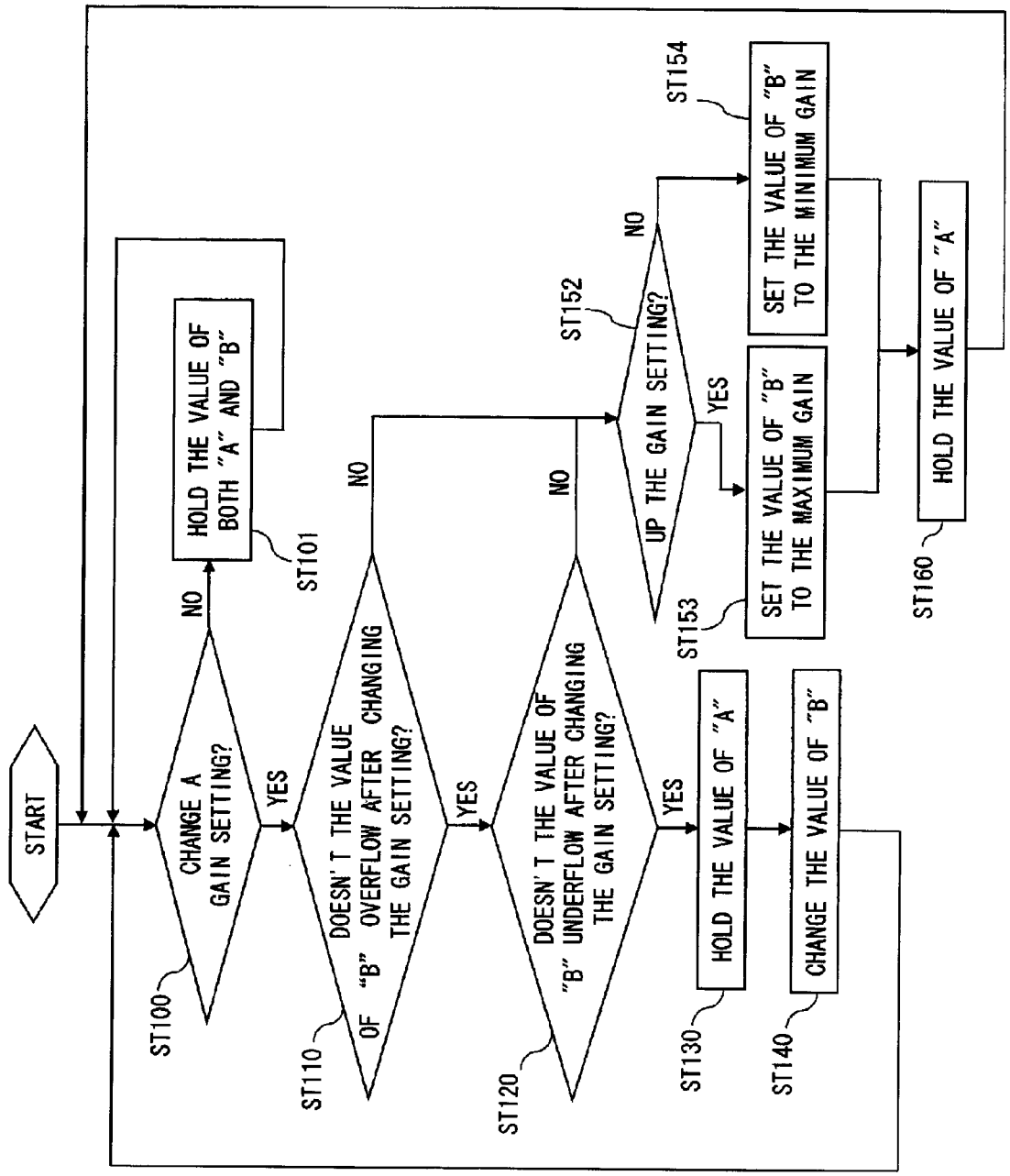
FIG. 10 is a flowchart showing the operation procedure of the gain controller in a third exemplary embodiment.
Figure 11:
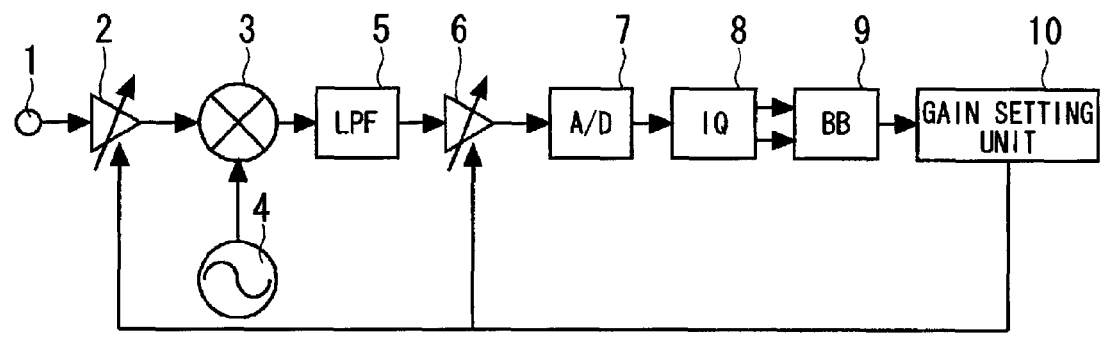
FIG. 11 is a general configuration of an intermediate frequency (hereinafter called IF) type receiver for digital TV as a related art.
Figure 12:
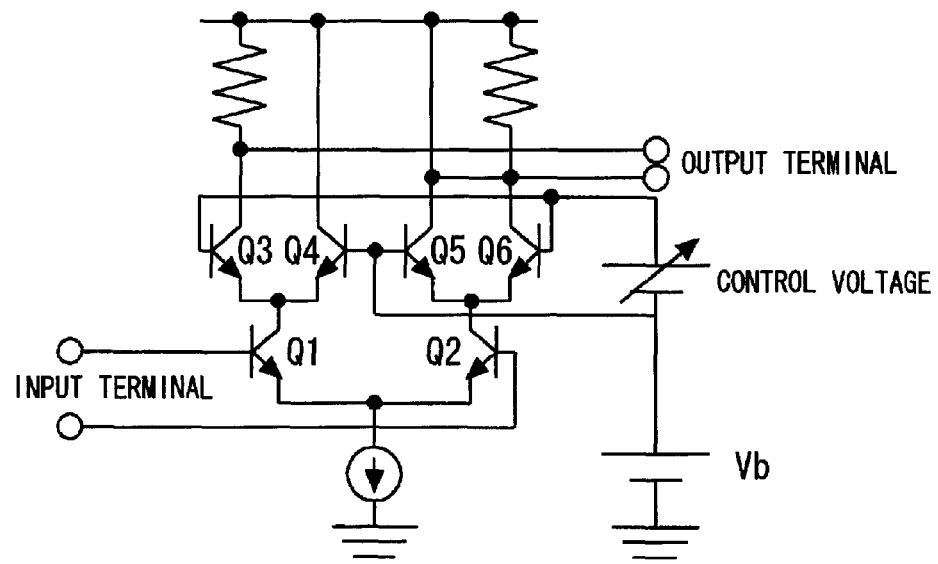
FIG. 12 is a typical circuit diagram of the valuable gain amplifier (VGA) as a related art.
Figure 13:
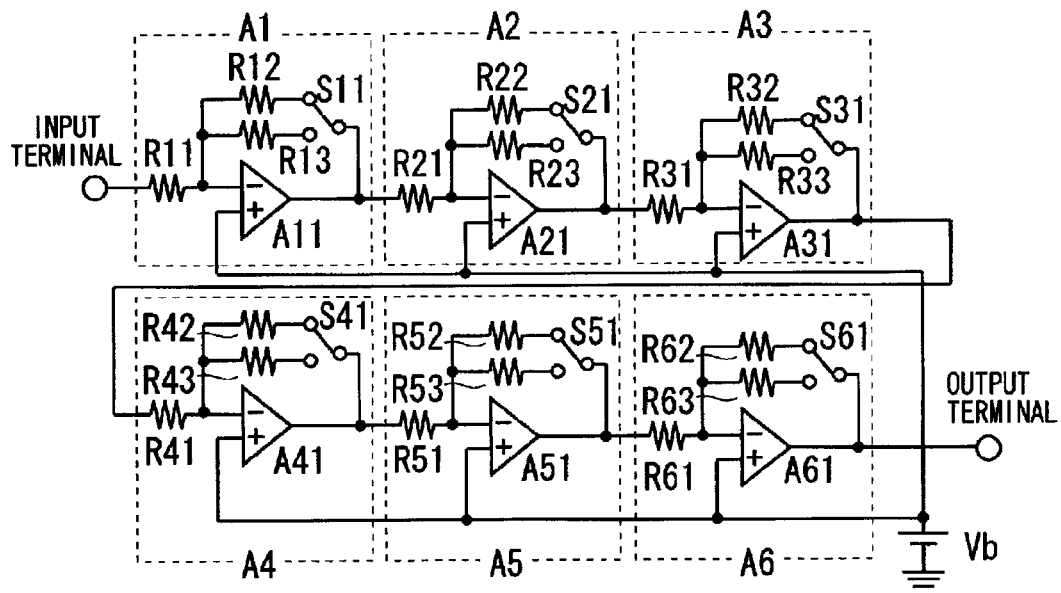
FIG. 13 is a typical circuit diagram of the programmable gain amplifier (PGA) as a related art.
Figure 14:
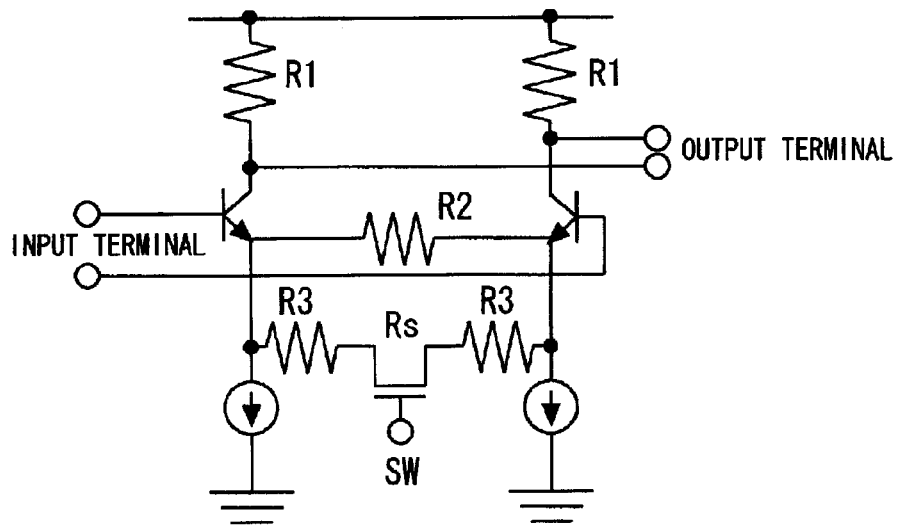
FIG. 14 is a typical circuit diagram of a differential amplifier circuit as programmable gain amplifier as a related art.

In FIG. 10, there is disclosed a flowchart showing the operation procedure of the gain controller 100 in the third exemplary embodiment. If the value of gain control signal "B" does not overflow or underflow with respect to the desired gain setting (ST110, ST120: YES), the control signal "A" is left unchanged (ST130), and the gain of amplifying device 90 is changed by the compensatory amplifier 99. This point is the same as the above-mentioned first exemplary embodiment.

Here, if the value of gain control signal "B" overflows or underflows with respect to the desired gain setting (ST110, ST120: NO), the control signal "A" is changed so as to become the optimal value with respect to the desired gain setting (ST160). At this time, in the third exemplary embodiment, the control signal "B" is changed according to the direction of gain change. That is, when the gain of amplifier 91-97 is raised (ST152: YES), the gain of compensatory amplifier 99 is set to the maximal gain (ST153). That is, "B" is changed to B=111. To the contrary, when the gain of amplifiers 91-97 is lowered (ST152: NO), the gain of compensatory amplifier 99 is set to the minimum gain (ST154). That is, "B" is changed to B=000.

As mentioned above, when the gain of the amplifiers 91-97 is raised, the gain of the compensatory amplifier 99 is changed to the maximum gain, and as a result, the gain variable range in which the gain can be changed downward by the compensatory amplifier 99 is secured. As a result, even if the gain of the amplifying device 90 rises excessively because of the error of amplifiers 91-97, the ability to correct the gain of amplifying device 90 downward by the compensatory amplifier 99 is surely secured. Further, when the gain of the amplifiers 91-97 is lowered, the gain of the compensatory amplifier 99 is changed to the minimum gain and the gain variable range in which the gain can be changed upward by the compensatory amplifier 99 is secured. As a result, even if the gain of the amplifying device 90 is lowered excessively because of the error of amplifiers 91-97, the ability to correct the gain of amplifying device 90 upward by the compensatory amplifier 99 is surely secured. According to such a configuration, the error of the amplifiers 91-97 can be surely and promptly adjusted by the compensatory amplifier 99. Therefore, the overlap of the gain setting of amplifiers, a large chip area and high current consumption, etc. in an attempt to maintain the linear controllability can be eliminated.

The exemplary embodiments mentioned above can be combined as desirable by one of ordinary skill in the art. While the invention has been described in terms of several exemplary embodiments, those skilled in the art will recognize that the invention can be practiced with various modifications within the spirit and scope of the appended claims and the invention is not limited to the examples described above. Further, the scope of the claims is not limited by the exemplary embodiments described above. Furthermore, it is noted that, Applicant's intent is to encompass equivalents of all claim elements, even if amended later during prosecution.

What is claimed is:

1. An amplifying device that amplifies an input signal of which a signal level varies to a prescribed desired level and output an output signal, the amplifying device comprising:
   a first amplifying unit capable of changing its gain in a stepwise manner so that an output of the first amplifying unit is changed in a stepwise manner, the first amplifying unit performing a primary gain adjustment;
   a second amplifying unit cascade-connected to the first amplifying unit, the second amplifying unit being capable of changing its gain in a stepwise manner so that an output of the second amplifying unit is changed in a stepwise manner, the second amplifying unit performing a compensating gain adjusting, an adjustable gain range of the second amplifying unit being narrower than the primary gain adjustment of the first amplifying unit, and the adjustable gain range of the second amplifying unit being overlapping with a part of the gain adjustment range of the first amplifying unit; and
   a gain controller comprising a primary gain setting logic circuit providing a first control signal set to the first amplifying unit and a compensating gain setting logic circuit providing a second control signal set to the second amplifying unit, wherein
   when the gain controller receives a gain setting signal, the gain controller determines whether the second amplifying unit can adjust a gain level of the output signal to a desired level based on the gain setting signal preferentially over using the first amplifying unit.

2. The amplifying device according to claim 1, wherein the gain step interval of the second amplifying unit is equal to or smaller than that of the first amplifying unit.

3. A control method of an amplifying device comprising i) a first amplifying unit capable of changing its gain in a stepwise manner; ii) a second amplifying unit cascade-connected to the first amplifying unit, the second amplifying unit being capable of changing its gain in a stepwise manner; and iii) a gain controller that controls the gain setting of the first amplifying unit and the second amplifying unit, wherein the first amplifying unit has a gain variable range necessary to amplifying the input signal to the prescribed desired level, the second amplifying unit has a gain variable range narrower than that of the first amplifying unit, and when the gain controller changes the gain setting, the gain controller uses the second amplifying unit preferentially over the first amplifying unit, said method comprising the steps of:
   the gain controller outputting a first control signal to control the first amplifying unit, and a second control signal to control the second amplifying unit;
   when the gain controller changes the gain setting of the amplifying device, the gain controller uses the second amplifying unit preferentially;
   when the gain setting is changed to desired gain setting, if it is determined that the signal value of the second control signal after the gain setting change is between the upper limit value and the lower limit value of the second control signal, the gain controller maintains the value of the first control signal and changes the value of the second control signal,
   when the gain setting is changed to desired gain setting, if it is determined that the signal value of the second control signal after the gain setting change overflows or underflows, the gain controller maintains the value of the second control signal and changes the value of the first control signal.

4. A control method of an amplifying device comprising i) a first amplifying unit capable of changing its gain in a stepwise manner; ii) a second amplifying unit cascade-connected to the first amplifying unit, the second amplifying unit being capable of changing its gain in a stepwise manner; and iii) a gain controller that controls the gain setting of the first amplifying unit and the second amplifying unit, wherein the first amplifying unit has a gain variable range necessary to amplifying the input signal to the prescribed desired level, the second amplifying unit has a gain variable range narrower than that of the first amplifying unit, and when the gain controller changes the gain setting, the gain controller uses the second amplifying unit preferentially over the first amplifying unit, said method comprising the steps of:
   the gain controller outputting a first control signal to control the first amplifying unit, and a second control signal to control the second amplifying unit;
   when the gain controller changes the gain setting of the amplifying device, the gain controller uses the second amplifying unit preferentially;
   when the gain setting is changed to desired gain setting, if it is determined that the signal value of the second control signal after the gain setting change is between the upper limit value and the lower limit value of the second control signal, the gain controller maintains the value of the first control signal and changes the value of the second control signal,
   when the gain setting is changed to desired gain setting, if it is determined that the signal value of the second control signal after the gain setting change overflows or underflows, the gain controller changes the value of the second control signal to a prescribed value determined in advance and changes the value of the first control signal.

5. The control method of the amplifying device according to claim 4, wherein the prescribed value of the second control signal is the median value of the gain variable range of the second amplifying unit.

6. The control method of the amplifying device according to claim 4, wherein the prescribed given value of the second control signal is the maximum value when the gain of the amplifying device is raised, and is the minimum value when the gain of the amplifying device is lowered.

7. The amplifying device according to claim 1, wherein the first amplifying unit and the second amplifying unit are each two-state amplifiers, each with two set output levels.

8. The amplifying device according to claim 1, wherein the first amplifying unit and the second amplifying unit are each discrete state amplifiers with set discrete output levels.

9. The amplifying device according to claim 1, wherein a minimum gain adjusting step range of the second amplifying unit is equal to a minimum gain adjusting step range of the first amplifying unit.

10. The amplifying device according to claim 1, wherein a minimum gain adjusting step range of the second amplifying unit is narrower than a minimum gain adjusting step range of the first amplifying unit.

11. The amplifying device according to claim 1, wherein first control signal set and the second control signal set are respectively formed as a binary code.

12. The amplifying device according to claim 1, wherein the first and second amplifying units are compatible to each other in setting to adjust the gain level of the output signal in a range that the adjustable gain range of the second amplifying unit is overlapped with the first amplifying unit.

13. The amplifying device according to claim 1, wherein
   the first amplifying unit comprises a plurality of amplifiers each of whose gain is switchable, and
   the second amplifying unit comprises at least one amplifier whose gain is switchable.

* * * * *